United States Patent
Morton et al.

(10) Patent No.: US 9,705,513 B2
(45) Date of Patent: Jul. 11, 2017

(54) FREQUENCY SOURCE WITH IMPROVED PHASE NOISE

(71) Applicant: RAYTHEON COMPANY, Waltham, MA (US)

(72) Inventors: Matthew A. Morton, Tewksbury, MA (US); Tina P. Srivastava, Tewksbury, MA (US)

(73) Assignee: RAYTHEON COMPANY, Waltham, MA (US)

( * ) Notice: Subject to any disclaimer, the term of this patent is extended or adjusted under 35 U.S.C. 154(b) by 157 days.

(21) Appl. No.: 14/560,824

(22) Filed: Dec. 4, 2014

(65) Prior Publication Data

US 2016/0164528 A1 Jun. 9, 2016

(51) Int. Cl.
*H03L 7/093* (2006.01)
*H03H 7/06* (2006.01)
*H03L 7/089* (2006.01)

(52) U.S. Cl.
CPC ............. *H03L 7/093* (2013.01); *H03H 7/06* (2013.01); *H03L 7/089* (2013.01)

(58) Field of Classification Search
CPC ...................................................... H03L 7/093
See application file for complete search history.

(56) References Cited

U.S. PATENT DOCUMENTS

| | | |
|---|---|---|
| 4,283,692 A | 8/1981 | Adam |
| 4,488,122 A | 12/1984 | Wolkstein |
| 5,307,516 A | 4/1994 | Nomoto |
| 5,483,161 A | 1/1996 | Deeter et al. |
| 5,523,725 A | 6/1996 | Ishikawa et al. |
| 5,785,752 A | 7/1998 | Tanno et al. |
| 5,802,463 A | 9/1998 | Zuckerman |
| 5,831,439 A | 11/1998 | Suenram et al. |
| 5,923,228 A | 7/1999 | Okada et al. |
| 6,028,495 A | 2/2000 | Umegaki |
| 6,111,911 A | 8/2000 | Sanderford, Jr. et al. |
| 6,584,304 B1 | 6/2003 | Thomsen et al. |
| 6,850,132 B2 | 2/2005 | Jun et al. |

(Continued)

OTHER PUBLICATIONS

International Search Report from related International Application No, PCT/US2015/063533, International Search Report dated Aug. 31, 2016 and mailed Sep. 8, 2016 (4 pgs.).

(Continued)

*Primary Examiner* — Hai L Nguyen
(74) *Attorney, Agent, or Firm* — Lewis Roca Rothgerber Christie LLP

(57) ABSTRACT

A frequency source with improved phase noise. In one embodiment a phase-locked loop is used as a component of a frequency source and a signal to noise enhancer (SNE) is used to suppress phase noise produced by the phase-locked loop. The signal to noise enhancer is a nonlinear passive device that attenuates low-power signals while transmitting high power signals with little loss. The signal to noise enhancer may be fabricated as a thin film of yttrium iron garnet (YIG) epitaxially grown on a gadolinium gallium garnet (GGG) substrate, the GGG substrate being secured to a microwave transmission line from the input to the output of the signal to noise enhancer, such that the thin film of yttrium iron garnet is close to the transmission line.

18 Claims, 6 Drawing Sheets

(56) References Cited

U.S. PATENT DOCUMENTS

| | | | |
|---|---|---|---|
| 6,937,112 B2* | 8/2005 | Jun | ............................ H01P 5/10 |
| | | | 333/122 |
| 6,975,264 B2 | 12/2005 | Nendick | |
| 7,092,043 B2 | 8/2006 | Vorenkamp et al. | |
| 7,542,519 B2 | 6/2009 | McCallister | |
| 7,693,491 B2 | 4/2010 | Pan | |
| 8,461,901 B1 | 6/2013 | Morton et al. | |
| 2003/0214363 A1 | 11/2003 | Jun et al. | |
| 2009/0184773 A1* | 7/2009 | Woo | ...................... H03L 7/0891 |
| | | | 331/1 R |
| 2012/0194893 A1 | 8/2012 | Maleki et al. | |

OTHER PUBLICATIONS

Written Opinion of the International Searching Authority from related International Application No. PCT/US2015/063533, mailed Sep. 8, 2016 (8 pgs.).

Saha et al., "A Tunable, SiGe X-band Image Reject Mixer," IEEE, pp. 196-199, 2010.

Stitzer et al., "Magnetostatic Surface Wave Signal-To-Noise Enhancer," IEEE MTT-S-Digest, Westinghouse Electric Corp., pp. 238-240, 1980.

Adam, "A Broadband Microwave Signal to Noise Enhancer," IEEE Transactions on Magn., 16(5):1168-1170, Sep. 1980.

Bohn et al., "Closed-Loop Spurious Tone Reduction for Self-Healing Frequency Synthesizers," IEEE, 4 pages, 2011.

Jeon et al., "A Scalable 6-to-18 GHz Concurrent Dual-Band Quad-Beam Phased-Array Receiver in CMOS," IEEE Journal of Solid-State Circuits, 43(12):2660-2673, Dec. 2008.

Kuki et al., "A Reflection Type of MSW Signal-To-Noise Enhancer in the 400-MHz Band," IEEE MTT-S Digest, pp. 111-114, 1995.

Nomoto et al., "A Signal-To-Noise Enhancer Using Two MSSW Filters and its Application to Noise Reduction in DBS Reception," IEEE Trans. on Microwave Theory and Tech., 41(8):1316-1322, Aug. 1993.

Wang et al., "A Tunable Concurrent 6-to-18GHz Phased-Array System in CMOS," IEEE, pp. 687-690, 2008.

* cited by examiner

FREQUENCY SOURCE WITH IMPROVED PHASE NOISE

BACKGROUND

1. Field

One or more aspects of embodiments according to the present invention relate to frequency sources, and more particularly to a system for suppressing phase noise in a frequency source.

2. Description of Related Art

Low cost, compact frequency synthesizers are useful elements in military and commercial applications, including, for example, in weather radar systems. Such frequency synthesizers, however, may have phase noise performance inferior to larger or higher cost designs, and this phase noise may make them unsuitable for some applications. Thus, there is a need for a system for improving the phase noise of a frequency synthesizer.

SUMMARY

Aspects of embodiments of the present disclosure are directed toward a frequency source with improved phase noise. In one embodiment a phase-locked loop is used as a component of a frequency source and a signal to noise enhancer (SNE) is used to suppress phase noise produced by the phase-locked loop. The signal to noise enhancer is a nonlinear passive device that attenuates low-power signals while transmitting high power signals with little loss. The signal to noise enhancer may be fabricated as a thin film of yttrium iron garnet (YIG) epitaxially grown on a gadolinium gallium garnet (GGG) substrate, the GGG substrate being secured to a microwave transmission line from the input to the output of the signal to noise enhancer, such that the thin film of yttrium iron garnet is close to the transmission line.

According to an embodiment of the present invention there is provided a frequency source, including: a phase-locked loop, having an input and an output; and a first signal-to-noise enhancer (SNE) having an input and an output, the input of the SNE being connected to the output of the phase-locked loop, the first SNE including: a microwave transmission line connected between the input and the output of the first SNE; a magnetic component capable of supporting magnetostatic waves; the magnetic component secured in proximity to the microwave transmission line; one or more magnets secured in proximity to the magnetic component; the first SNE having the characteristic of allowing a signal to propagate from the input of the first SNE to the output of the first SNE: with a first attenuation when the power of the signal at the input of the SNE is less than a first threshold, and with a second attenuation when the power of the signal at the input of the SNE is greater than a second threshold, the first attenuation exceeding the second attenuation by at least 5 decibels (dB).

In one embodiment, the magnetic component includes a thin film of yttrium iron garnet (YIG) on a gadolinium gallium garnet (GGG) substrate.

In one embodiment, the thin film of YIG is a single crystal of YIG, the GGG substrate is a single crystal of GGG, and the thin film of YIG is lattice-matched to the GGG substrate.

In one embodiment, a portion of the transmission line in proximity with the magnetic component follows a substantially straight path.

In one embodiment, the one or more magnets include two magnets, positioned and oriented with respect to the portion of the microwave transmission line so as to produce, in the magnetic component, a biasing magnetic field substantially parallel to the portion of the microwave transmission line.

In one embodiment, the phase-locked loop includes: a voltage-controlled oscillator (VCO) having an input and an output; a phase and frequency detector (PFD) having a first input, a second input, and an output, the first input of the PFD being connected to the output of the VCO; a charge pump having an input and an output, the input of the charge pump being connected to the output of the PFD; and a loop filter having an input and an output, the input of the loop filter being connected to the output of the charge pump, the output of the loop filter being connected to the input of the VCO, the output of the VCO being connected to the output of the phase-locked loop.

In one embodiment, the phase-locked loop further includes a static divider connected between the VCO and the PFD.

In one embodiment, the phase-locked loop further includes a programmable divider connected between the static divider and the PFD.

In one embodiment, the phase-locked loop further includes a timing circuit connected between the VCO and the PFD.

In one embodiment, the timing circuit includes a D flip-flop having a data input, a clock input, and a data output.

In one embodiment, the clock input of the D flip-flop is connected to an output of the static divider, and the data input of the D flip-flop is connected to an output of the programmable divider.

In one embodiment, the frequency includes a dead zone eliminator connected between the PFD and the charge pump.

In one embodiment, the dead zone eliminator includes a set-reset latch, an AND gate, and two OR gates.

In one embodiment, the loop filter consists of a network of resistors and capacitors.

In one embodiment, the phase-locked loop further includes a first amplifier connected between the output of the VCO and the output of the phase-locked loop.

In one embodiment, the first amplifier has a gain selected to provide an input power level greater than the second threshold at the input of the SNE.

In one embodiment, the frequency includes a second amplifier connected between the output of the phase-locked loop and the SNE.

In one embodiment, the second amplifier has a gain selected to provide an input power level greater than the second threshold at the input of the SNE.

In one embodiment, the frequency includes a frequency reference having an output, the output of the frequency reference being connected to the second input of the PFD.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a frequency source with improved phase noise provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Low cost, compact frequency synthesizers may be useful in commercial and military applications, especially in systems employing phased arrays, where independent frequency synthesizers or "frequency sources" at every element may provide a log(N) improvement in phase noise, where N is the number of frequency sources. While the phase noise performance of these low cost frequency synthesizers may be significantly worse than a relatively large ultra-low phase noise source that may be used to drive an entire phased array system, the log(N) improvement may in some cases be sufficient to meet phase noise requirements.

If a frequency synthesizer is to be used at every antenna element, it may be required to be sufficiently small to fit within the antenna array lattice (along with the rest of the frequency conversion circuitry). Silicon-based phase-locked loops (PLLs) may be made compact, and also may be fabricated at low cost, making them well suited to these applications in some cases. Silicon also may provide a high degree of programmability, enabling the PLL to tune over a wide range of frequencies while providing control over coarse and fine corrections to parasitics and biasing points.

Figure 1:
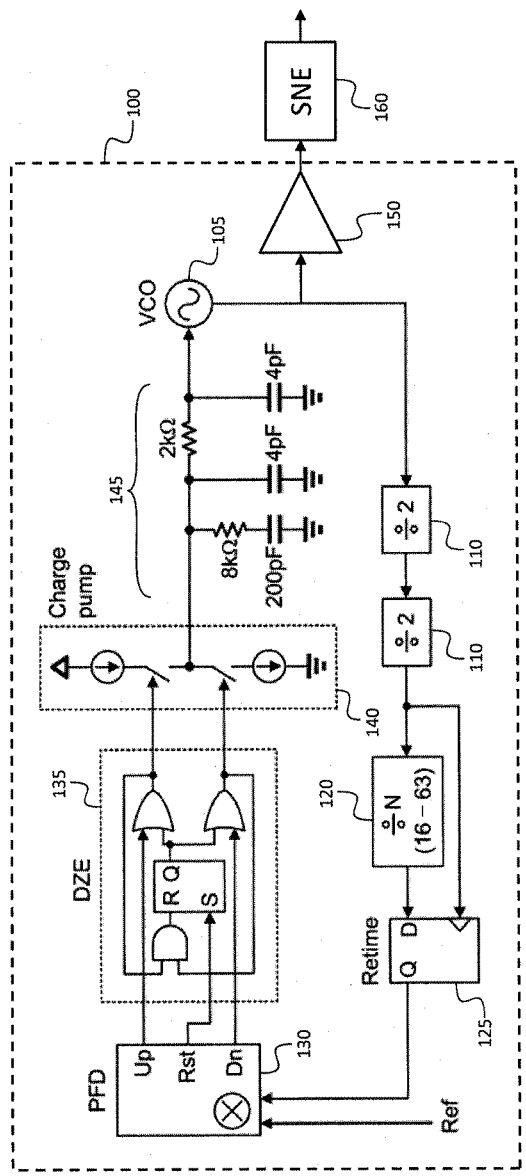
FIG. 1 is a block diagram of a frequency source with improved phase noise according to an embodiment of the present invention.

Referring to FIG. 1, in one embodiment a PLL 100 suitable for fabrication in silicon includes a voltage controlled oscillator (VCO) 105, and moving clockwise, two static dividers 110, a programmable divider 120, a timing circuit 125, a phase and frequency detector (PFD) 130, a dead zone elimination circuit (DZE circuit) 135, a charge pump 140, and a network forming the loop filter 145. During operation, the VCO oscillates at a frequency correlated to the VCO input voltage provided by the loop filter. This VCO output is fed to the static dividers 110 and then to the programmable divider 120. The PFD may have two inputs, one to receive a reference signal from a frequency reference, and one to receive the output signal from the last divider, i.e., a signal that is the VCO signal divided by an integer to reduce its frequency to a suitable fraction of the VCO frequency. The output of the dividers 110, 120 is conditioned using a timing circuit 125 to ensure the resulting output can be synchronized with the reference frequency. The timing circuit 125 may be a D flip-flop having a data input and a data output, and a clock input; the data input may be connected to the output of the last divider (e.g., a programmable divider 120), and the clock input may be connected to the preceding divider (e.g., a static divider 110). If the total division ratio is set to M, the output frequency of the timing circuit will be the VCO frequency divided by M. The PFD compares the divided frequency signal to a static reference frequency (e.g., the frequency of a signal provided by a frequency reference 520 (FIG. 5)), and ultimately controls the charge pump, e.g., to increase the VCO input voltage if the divided VCO frequency is too low or to decrease the VCO input voltage if the divided VCO frequency is too high. This is accomplished by introducing or removing charge from the loop filter 145, where charge is added, removed, or maintained at a rate determined by the reference frequency. An optional dead zone eliminator circuit 135 may be connected, as an intervening element, between the PFD 130 and the charge pump 140. The dead zone elimination circuit may include a set-reset latch, an AND gate, and two OR gates, connected as shown in FIG. 1. The PLL 100 may include an amplifier 150 at the output of the PLL 100 to provide a desired power level at the output of the PLL 100 and also to isolate the VCO 105 from any external load that may be connected to the output of the PLL 100. The loop filter bandwidth sets the bandwidth of the loop, where either the phase noise or the locking speed can be optimized. This approach may lead to a widely tunable frequency synthesizer that covers very large operational bandwidths (>50%) yet maintains a very compact form factor (<2 mm$^2$).

Further, reasonable phase noise may be achieved with such a device. The phase noise close to mean operating frequency of the VCO, or "carrier", may be dominated by circuits within the loop such as the charge pump, PFD, and dividers. Farther from the carrier, the phase noise may have a peak at or near the bandwidth, set by the PLL loop filter, of the PLL loop, e.g., at or near 3 MHz. The phase noise may also include one or more spikes, or "reference spurs" at frequencies separated from the carrier by the reference frequency or harmonics of the reference frequency; these spikes may be caused by the PFD removing and supplying charge to the loop filter at a rate corresponding to the reference frequency.

It may be desirable to further decrease the phase noise associated with the loop filter and the frequency reference. One method to decrease the phase noise would be to use an extremely high quality factor (high-Q) filter (such as a surface acoustic wave (SAW) resonator) at the output of the PLL (e.g., at the output of the amplifier 150 after the VCO 105). Such filters may however be problematic for widely tunable frequency synthesizers because they may be difficult or impossible to tune. Alternative approaches using additional charge injection may be suitable for driving down reference spurs by an additional 10 dB, but the calibration routines required may be complex and require embedded microprocessors to achieve the 10 dB improvement. Charge injection approaches may also provide no improvement to the loop filter noise profile, and may tend to increase close-in phase noise because of the additional active circuitry required within the loop.

Figure 2:
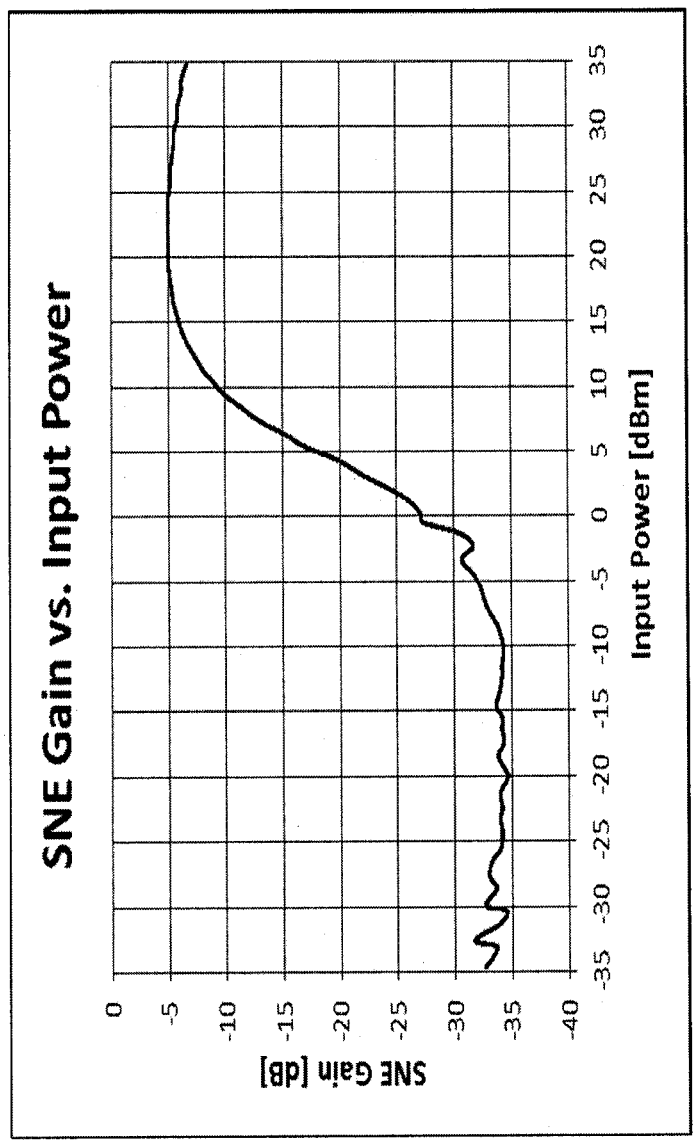
FIG. 2 is a graph of the gain of a signal to noise enhancer as a function of input power, according to an embodiment of the present invention.

To overcome some of these disadvantages, in one embodiment a signal to noise enhancer (SNE) 160 may be connected in series with the output of the PLL, to further improve the phase noise. The SNE 160 is a nonlinear passive device that attenuates signals below a first threshold power while passing signals above a second threshold power. FIG. 2 shows the gain of an SNE 160 as a function of input power, when the input contains a single tone within the operating frequency range of the SNE 160. As the power is increased from −35 dBm to −9 dBm, the transmission loss remains greater than 32 dB (i.e., the gain remains less than −32 dB). As the power is increased above a first threshold power of −9 dBm, the loss decreases (i.e., the gain increases) to reach a loss of approximately 8 dB at a second threshold power of 12 dBm. Thus, the SNE 160 provides high attenuation for signals with power below the first threshold power and low attenuation for signals with power above the second threshold power, the difference, in this example, being approximately 24 dB. The characteristics of an SNE 160 may vary according to the details of its design, so that an SNE 160 may exhibit, for example, less loss for a high-power tone, and the difference in attenuation between a high power tone and a low power tone (which also depends on how the first and second power thresholds are chosen) may be greater or less than the 24 dB of this example. In embodiments of the present invention, an SNE 160 with a difference in attenuation (between a high power tone and a low power tone) of as little as 5 dB may provide useful performance benefits.

Figure 3:
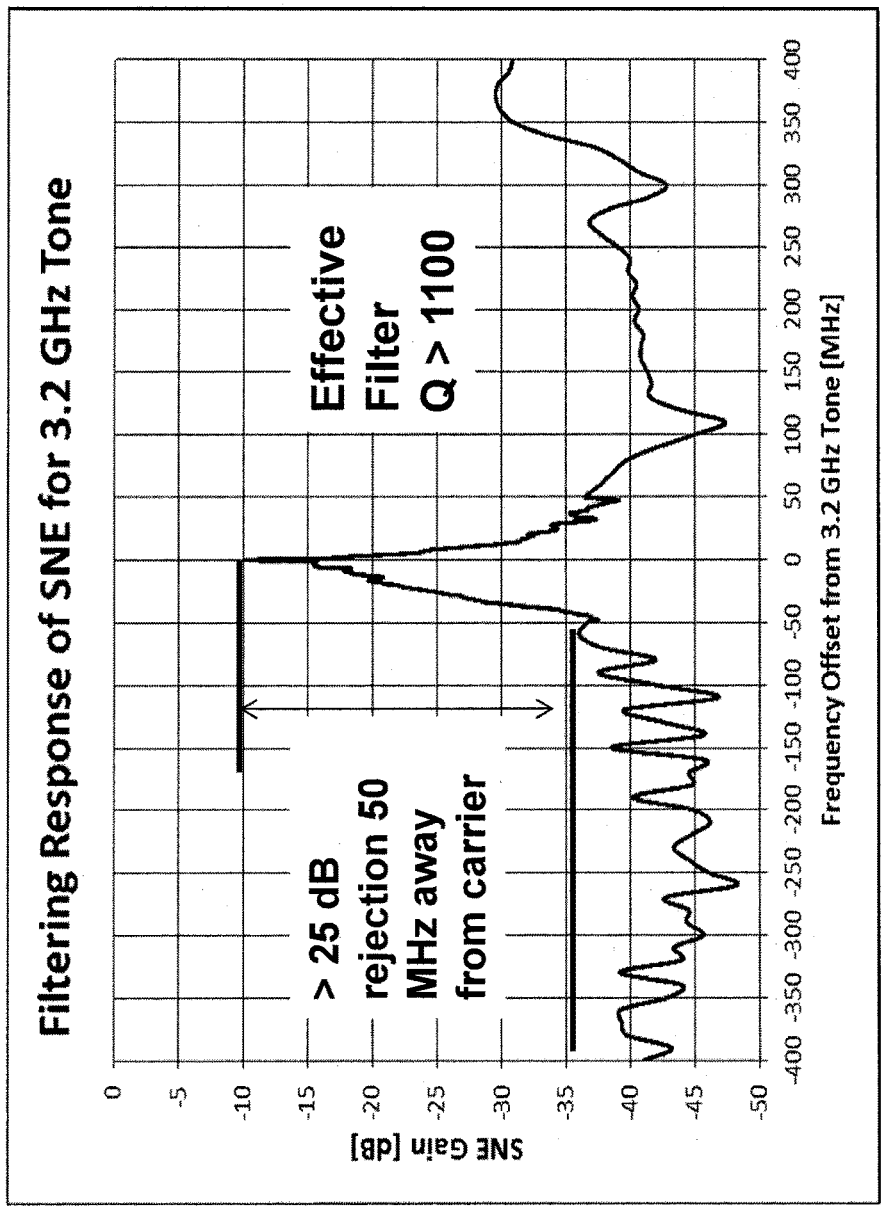
FIG. 3 is a graph of the gain of a signal to noise enhancer as a function of input frequency relative to the frequency of a principal tone, according to an embodiment of the present invention.

Referring to FIG. 3, a key feature of the SNE is the frequency selective nature of the high-power passband: low power signals close in frequency to the passed high-power signals are subject to high levels of attenuation. In particular, referring to FIG. 3, when the input signal includes a principal 12 dBm tone at 3.2 GHz and one or more weak signals at other frequencies, the principal tone is attenuated by 10 dB or less and signals at other frequencies that are 50 MHz or more from the principal tone are attenuated by at least 25 dB more than the amount by which the principal tone is attenuated. To achieve this level of attenuation 50 MHz from the center frequency of 3.2 GHz, a conventional linear filter would need a quality factor (Q) of over 1000. In this sense, the SNE acts as a high-Q (>1000) notch filter that automatically tunes to pass high power signals while rejecting low power signals in adjacent frequency bands.

The characteristic of FIG. 3 corresponds to a measurement in which a low-power test tone was swept in frequency over a first range of frequencies extending below the frequency of the principal tone, and over a second range of frequencies extending above the frequency of the principal tone. Measurements of the attenuation of a test tone very near in frequency to the principal tone are challenging because of the large amplitude difference between the test tone and the principal tone; the characteristic of FIG. 3 thus excludes measurements of the attenuation (expected to be less than the minimum 10 dB attenuation shown) over a small frequency interval including the principal tone.

Figure 4:
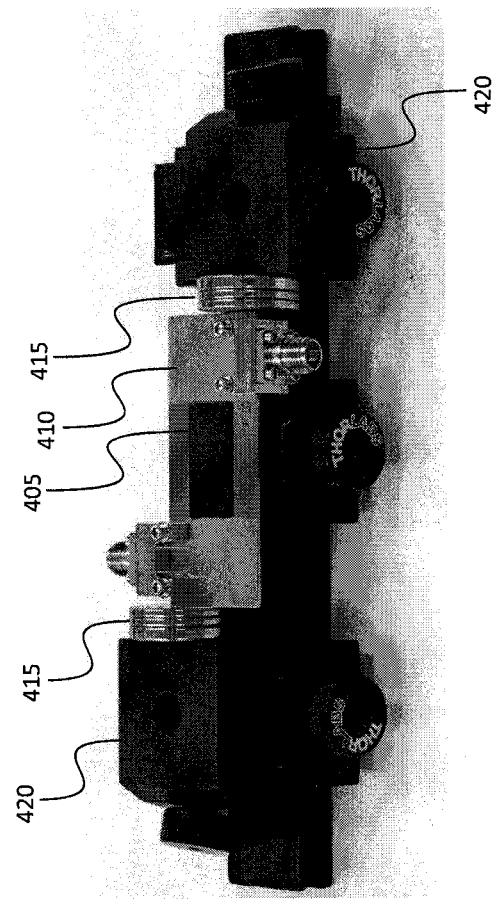
FIG. 4 is a photograph of a signal to noise enhancer, according to an embodiment of the present invention.

In one embodiment, the SNE is built according to the disclosure in U.S. Pat. No. 4,283,692, (the "'692 Patent"), which is incorporated herein by reference in its entirety. FIG. 4 is a photograph of a prototype SNE. A thin film of yttrium iron garnet (YIG) epitaxially grown on a gadolinium gallium garnet (GGG) substrate 405 is secured, with the thin film side down, on or immediately above a straight portion of a microstrip transmission line fabricated on a surface of a dielectric substrate 410. A DC bias magnetic field is applied to the YIG sample in a direction parallel to the straight portion of the microstrip transmission line by two magnets 415. Each magnet may be a permanent magnet, as shown in FIG. 4, or it may be any other variety of magnet, such as an electromagnet. The thin film of YIG and the GGG substrate may each be a single crystal, and the thin film of YIG may be lattice-matched to the GGG substrate. In the prototype SNE of FIG. 4 the positions of the magnets are adjustable using translation stages 420; in a production unit the magnets may be installed in fixed positions identified, using the prototype, by adjusting the magnet positions in the prototype for acceptable performance. In other embodiments a single magnet may be used instead of a pair of magnets, or more than two magnets may be used.

In one embodiment, the propagation of electromagnetic signals along the transmission line excites magnetostatic waves (MSW) in the YIG film of the SNE; the MSW are long wavelength spin waves which may propagate at microwave frequencies in ferromagnetic materials placed within a biasing magnetic field. Microwave energy is coupled from the transmission line to MSW that propagate away from the transmission line. In order to prevent the MSW from reflecting from the edge of the film and interfering with the signal propagating along the transmission line, the edge of the film may be ground at an angle, e.g., forming a bevel on the lower edges of the GGG substrate and YIG film, or the GGG substrate may be formed as a curved surface (e.g., the GGG substrate and YIG film may be in the shape of a circular disk). In other embodiments the MSW may be attenuated using a conductive material, such as a 0.6 nm layer of aluminum, deposited onto the surface of the microstrip dielectric substrate, sufficiently far from the transmission line to avoid significantly affecting modes propagating in the transmission line.

The coupling of energy from waves travelling in the microstrip transmission line into magnetostatic surface waves may be increased by depositing a metal (e.g., gold) film on the YIG film in a pattern forming a slot parallel to the microstrip transmission line, or a coplanar structure with a central conductor parallel to the microstrip transmission line, between two coplanar ground planes.

In operation, magnetostatic surface waves are launched and propagated in the YIG film in response to an input signal applied to the microstrip transmission line. Magnetostatic volume waves are also possible with different directions of the magnetizing field relative to the YIG film, as is well known to those skilled in the art. Magnetostatic surface waves and magnetostatic volume waves are collectively referred to herein as magnetostatic waves (MSW). The launching of a magnetostatic wave removes power from the transmission line such that the output signal at the output of the SNE is attenuated relative to the input signal at the input of the SNE.

Due to the nonlinear nature of the MSW excitation and propagation, the amount of energy that can be coupled from the transmission line to MSW is limited. Therefore, above a certain power level of the exciting signal, saturation occurs and no additional power can be coupled to MSW. As a result, for low signal power levels, the microwave energy is coupled from the transmission line to MSW. In contrast, for high signal power levels, the coupling to MSW saturates and the amount of loss imparted on the signal propagating from the input to the output of the SNE is reduced. This behavior gives rise to a significant enhancement of the signal-to-noise ratio when the noise power is less than the first threshold power of the SNE and the signal is a tone with power greater than the second threshold power of the SNE.

An SNE may provide improved rejection of phase noise generated by the loop filter and reference spurs over the state of the art. Further, the auto-tuning nature of the SNE and the SNE's ability to achieve a high-Q filter response over a wide operational tuning range without additional control may make the proposed architecture suitable for wideband frequency converting systems.

Figure 5:
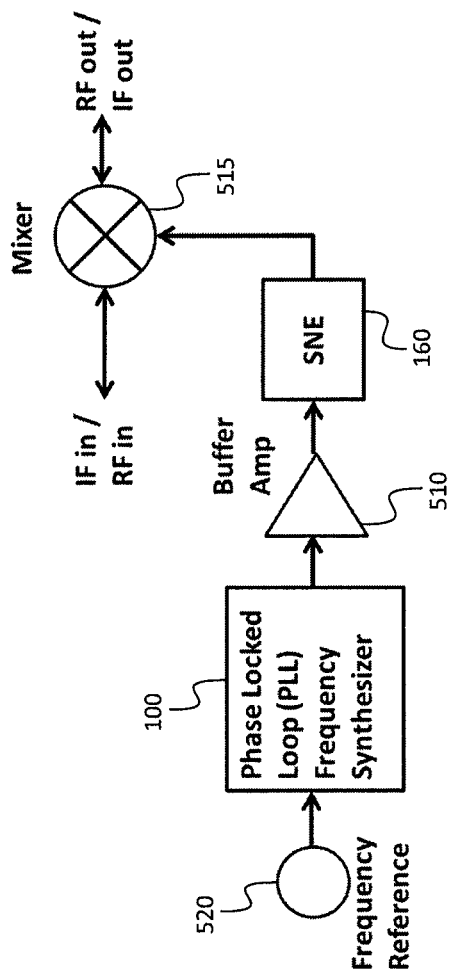
FIG. 5 is a block diagram of a frequency source with improved phase noise employed as a local oscillator according to an embodiment of the present invention.

Referring to FIG. 5, in one embodiment a frequency source includes a PLL 100, used in conjunction with a buffer amplifier 510, driving an SNE 160, the SNE output driving the local oscillator (LO) input of a mixer 515, and a frequency reference 520 providing a reference frequency for the PLL. The buffer amplifier 510 may be the only amplifier between the VCO 105 of the PLL 100 (FIG. 1), if the PLL 100 lacks an amplifier 150 at the output, or it may be an additional amplifier, used, e.g., to provide sufficient gain to keep the signal at the input of the SNE 160 within the design input power range of the SNE 160, which may be 15-25 dBm, although in some embodiments an SNE may have a design input power range with a significantly higher upper limit.

In this embodiment, the carrier tone provided by the PLL 100 is at a sufficiently high power level after the buffer amplifier that the SNE 160 passes the carrier (as it is above the first threshold power) but rejects all other frequency content including the peak near the bandwidth of the loop, and reference spurs. The resulting filter profile creates a response similar to that of a filter with a Q on the order of 1,000. While not sufficient to significantly reduce close-in phase noise (e.g., phase noise less than 10 kHz from the carrier), the filtering response of an SNE 160 may demonstrate onset of attenuation in less than 1 MHz offset from the carrier, with 15 dB or more attenuation at 10 MHz offset.

Figure 6:
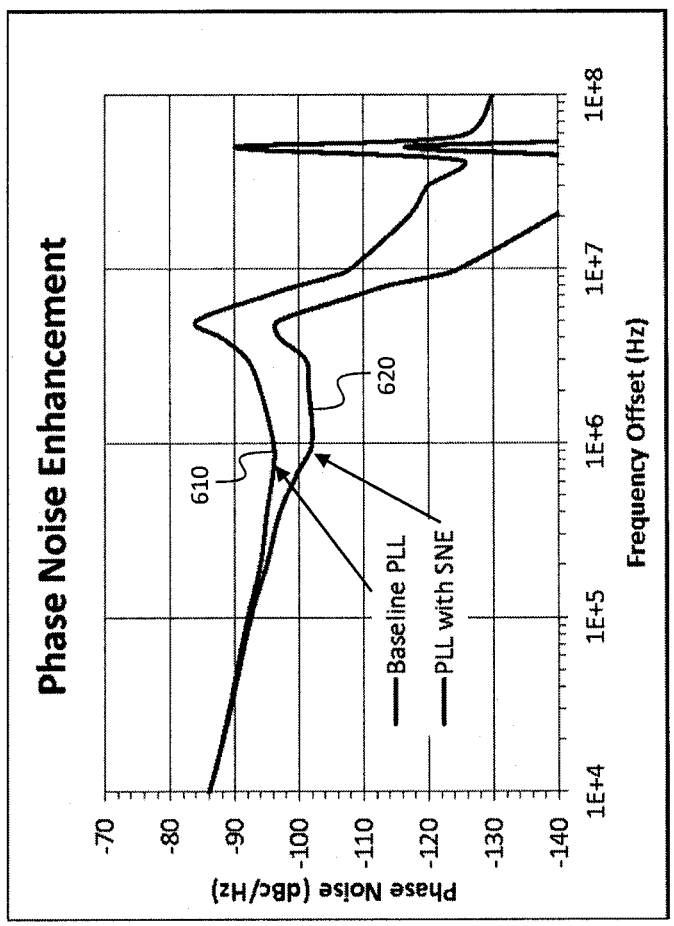
FIG. 6 is a graph of phase noise as a function of frequency according to an embodiment of the present invention.

This filtering response is sufficient in one embodiment to significantly improve the phase noise performance of a PLL, as shown in FIG. 6. Here, the "baseline" phase noise response of a representative silicon PLL is shown in a first curve 610, and the response provided by a PLL with the benefits of phase noise suppression provided by an SNE is shown in a second curve 620. For offsets less than 10 kHz, little improvement is seen. However, the 3 MHz loop filter spur may be reduced by more than 10 dB, while the reference spur may be reduced by more than 25 dB. This embodiment requires no calibration, automatically tunes over an octave of operational bandwidth, and provides cancellation of all reference spur harmonics. It should be noted that the filtering response has a finite transient behavior, requiring setup times on the order of 10's to 100's of nanoseconds (ns) to respond to changes in frequency. However, this response time corresponds to a loop filter bandwidth of greater than 5 MHz, hence the loop filter remains the limiting factor in the time required to change to a new locked frequency.

In one embodiment the SNE is fabricated to be sufficiently small to accommodate microwave lattice spacing (particularly for frequencies at C-band and below), and the system of FIG. 5 may be used in a phased array system at every element, to achieve an additional log(N) improvement in phase noise. For systems in which the phase noise requirement drives the number of elements required, the system of FIG. 5 may improve the loop filter and reference frequency spurs to the extent that 10 times or 100 times fewer elements may be required, respectively, if either of these two sources of phase noise drives the requirement for the number of elements. In other embodiments, the circuit of FIG. 5 may be modified by inserting a power splitter after the SNE, and connecting the outputs of the power splitter to the LO inputs of several mixers, so that, for example, in a phased array antenna, some of the benefits of having multiple frequency sources are preserved while relaxing the requirement for dense packing of the frequency sources.

Embodiments of the present invention provide a significant improvement in the phase noise of frequency synthesizer systems, automatically adapting to the instantaneous operating environment, requiring no input or control from the user, and no need for calibration. The reduction in phase noise attributed to the loop filter and frequency reference spurs in phase-locked loop synthesizer architectures significantly improves the spurious performance of low-cost and miniature receivers, improving the phase noise performance of phased array systems for improved compatibility with military and the most stringent commercial applications. Embodiments of the present invention provide improved frequency agility, and reduced control and calibration to achieve such performance. Embodiments of the present have a wide range of potential applications including commercial applications such as weather radar.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of present invention". Also, the term "exemplary" is intended to refer to an example or illustration.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In the case of a first element connected to a second element, a third, intervening element may be referred to as being "connected between" the first element and the second element. In contrast, when an element or layer is referred to as being "directly on," "directly connected to", "directly coupled to", or "immediately adjacent to" another element or layer, there are no intervening elements or layers present.

Although limited embodiments of a frequency source with improved phase noise have been specifically described and illustrated herein, many modifications and variations will be apparent to those skilled in the art. Accordingly, it is to be understood that a frequency source with improved phase noise employed according to principles of this invention may be embodied other than as specifically described herein. The invention is also defined in the following claims, and equivalents thereof.

What is claimed is:

1. A frequency source, comprising:
a phase-locked loop, having an input and an output; and
a first signal-to-noise enhancer (SNE) having an input and an output, the input of the SNE being connected to the output of the phase-locked loop, the first SNE comprising:
  a microwave transmission line connected between the input and the output of the first SNE;
  a magnetic component capable of supporting magnetostatic waves, the magnetic component secured in proximity to the microwave transmission line;
  one or more magnets secured in proximity to the magnetic component;
the first SNE having the characteristic of allowing a signal to propagate from the input of the first SNE to the output of the first SNE:
  with a first attenuation when the power of the signal at the input of the SNE is less than a first threshold, and
  with a second attenuation when the power of the signal at the input of the SNE is greater than a second threshold,
the first attenuation exceeding the second attenuation by at least 5 decibels (dB).

2. The frequency source of claim 1, wherein the magnetic component comprises a thin film of yttrium iron garnet (YIG) on a gadolinium gallium garnet (GGG) substrate.

3. The frequency source of claim 2, wherein the thin film of YIG is a single crystal of YIG, the GGG substrate is a single crystal of GGG, and the thin film of YIG is lattice-matched to the GGG substrate.

4. The frequency source of claim 1, wherein a portion of the transmission line in proximity with the magnetic component follows a substantially straight path.

5. The frequency source of claim 4, wherein the one or more magnets comprise two magnets, positioned and oriented with respect to the portion of the microwave transmission line so as to produce, in the magnetic component, a biasing magnetic field substantially parallel to the portion of the microwave transmission line.

6. The frequency source of claim 1, wherein the phase-locked loop comprises:
a voltage-controlled oscillator (VCO) having an input and an output;
a phase and frequency detector (PFD) having a first input, a second input, and an output, the first input of the PFD being connected to the output of the VCO;
a charge pump having an input and an output, the input of the charge pump being connected to the output of the PFD; and
a loop filter having an input and an output, the input of the loop filter being connected to the output of the charge pump, the output of the loop filter being connected to the input of the VCO,
the output of the VCO being:
  directly connected to the output of the phase-locked loop, or
  connected to the output of the phase-locked loop through a first amplifier.

7. The frequency source of claim 6, wherein the phase-locked loop further comprises a static divider connected between the VCO and the PFD.

8. The frequency source of claim 7, wherein the phase-locked loop further comprises a programmable divider connected between the static divider and the PFD.

9. The frequency source of claim 8 wherein the phase-locked loop further comprises a timing circuit connected between the VCO and the PFD.

10. The frequency source of claim 9 wherein the timing circuit comprises a D flip-flop having a data input, a clock input, and a data output, wherein the clock input of the D flip-flop is connected to an output of the static divider, and the data input of the D flip-flop is connected to an output of the programmable divider.

11. The frequency source of claim 6, further comprising a frequency reference having an output, the output of the frequency reference being connected to the second input of the PFD.

12. The frequency source of claim 6, further comprising a dead zone eliminator connected between the PFD and the charge pump.

13. The frequency source of claim 12, wherein the dead zone eliminator comprises a set-reset latch, an AND gate, and two OR gates,
  an output of the AND gate being connected to an input of the set-reset latch, and
  an output of the set-reset latch being connected to a respective input of each of the two OR gates.

14. The frequency source of claim 6, wherein the loop filter consists of a network of resistors and capacitors.

15. The frequency source of claim 6, wherein the phase-locked loop further comprises a first amplifier connected between the output of the VCO and the output of the phase-locked loop.

16. The frequency source of claim 15, wherein the first amplifier has a gain selected to provide an input power level greater than the second threshold at the input of the SNE.

17. The frequency source of claim 15, further comprising a second amplifier connected between the output of the phase-locked loop and the SNE.

18. The frequency source of claim 17, wherein the second amplifier has a gain selected to provide an input power level greater than the second threshold at the input of the SNE.

* * * * *